(12) United States Patent
Yamaguchi (10) Patent No.: US 12,557,649 B2
(45) Date of Patent: Feb. 17, 2026

(54) SEMICONDUCTOR MODULE (71) Applicant: Mitsubishi Electric Corporation, Tokyo (JP)

(72) Inventor: Kosuke Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 497 days.

(21) Appl. No.: 17/806,189

(22) Filed: Jun. 9, 2022

(65) Prior Publication Data
US 2023/0057915 A1    Feb. 23, 2023

(30) Foreign Application Priority Data

Aug. 18, 2021 (JP) ................................ 2021-133190

(51) Int. Cl.
*H01L 23/373* (2006.01)
*H01L 23/367* (2006.01)

(52) U.S. Cl.
CPC ...... *H01L 23/3735* (2013.01); *H01L 23/3672* (2013.01)

(58) Field of Classification Search
CPC . H01L 23/3735; H01L 23/3672; H01L 23/42; H01L 23/481; H01L 23/3731;
(Continued)

(56) References Cited

U.S. PATENT DOCUMENTS 7,659,615 B2 * 2/2010 Oman ................. H01L 23/3128
257/E23.101
10,141,182 B1 * 11/2018 Molla .................... H01L 23/36
(Continued)

FOREIGN PATENT DOCUMENTS

JP    H05-109943 A    4/1993
JP    11354696 A  * 12/1999 ............. H01L 23/36
(Continued)

OTHER PUBLICATIONS

Iwase, Heat Radiating Structure for Heat Generating Electronic Component, 1999,machien translation of JP 11-354696, pp. 1-3. (Year: 1999).*
(Continued)

*Primary Examiner* — Natalia A Gondarenko
(74) *Attorney, Agent, or Firm* — Studebaker Brackett PLLC (57) ABSTRACT

An object is to provide a semiconductor module capable achieving both a heat radiation property and an insulation property. A semiconductor module includes: a substrate having a main surface and a main surface on a side opposite to the main surface; a semiconductor device mounted on the main surface; and a heat sink attached to the main surface via an insulation sheet having a thermal conductivity, wherein the substrate includes a through hole passing from the main surface to the main surface, the semiconductor device includes a plurality of electrodes exposed from a surface facing the main surface and a protrusion formed between the plurality of electrodes to be inserted through the through hole, and the insulation sheet is formed so that a length in a thickness direction of the substrate is larger than a length of a tip end portion of the protrusion protruding from the through hole.

10 Claims, 6 Drawing Sheets

(58) Field of Classification Search
CPC ........... H01L 23/3677; H01L 23/49827; H01L 23/5384; H01L 23/36–3738; H01L 23/4006; H01L 23/4012; H01L 23/522–5389; H01L 24/13; H01L 24/16; H01L 24/26–33; H01L 2224/26–33519; H01L 2224/73–73281; H01L 2224/05085–05098; H01L 2224/8203–82047; H01L 2224/16227; H01L 2224/17519; H01L 2224/13025; H01L 21/76898; H01L 21/4803; H01L 21/4882; H01L 25/043; H01L 25/0657; H01L 25/074; H01L 25/0756; H01L 25/117
USPC .................................................. 257/713, 706
See application file for complete search history.

(56) References Cited

U.S. PATENT DOCUMENTS

| | | | | |
|---|---|---|---|---|
| 2004/0037057 | A1* | 2/2004 | Okada | H05K 1/0206 257/E23.105 |
| 2004/0227230 | A1* | 11/2004 | Chou | H05K 3/0058 257/713 |
| 2011/0013365 | A1 | 1/2011 | Oota | |
| 2013/0314920 | A1* | 11/2013 | Park | H01L 23/3677 362/249.02 |
| 2020/0126884 | A1* | 4/2020 | Shikama | H05K 7/205 |
| 2020/0343155 | A1 | 10/2020 | Kiyonaga et al. | |
| 2021/0057895 | A1* | 2/2021 | Takamizawa | H05K 3/4046 |

FOREIGN PATENT DOCUMENTS

| | | |
|---|---|---|
| JP | 2011-023593 A | 2/2011 |
| JP | 2014-207275 A | 10/2014 |
| WO | 2019/146402 A1 | 8/2019 |

OTHER PUBLICATIONS

An Office Action; "Notice of Reasons for Refusal," mailed by the Japanese Patent Office on Jul. 2, 2024, which corresponds to Japanese Patent Application No. 2021-133190 and is related to U.S. Appl. No. 17/806,189; with English language translation.

"Notice of Reasons for Refusal" Office Action issued in JP 2021-133190; mailed by the Japanese Patent Office on Dec. 3, 2024.

An Office Action issued by the German Patent and Trademark Office on Sep. 19, 2025, which corresponds to German Patent Application No. 102022119189.3 and is related to U.S. Appl. No. 17/806,189; with English language translation.

* cited by examiner

SEMICONDUCTOR MODULE

BACKGROUND OF THE INVENTION

Field of the Invention

The present disclosure relates to a semiconductor module.

Description of the Background Art

A surface-mount semiconductor module is generally used without a heat sink. In this case, heat generated in a semiconductor chip in a package is radiated to the air from a surface of resin constituting the package through the resin, or is radiated to a substrate via an electrode passing from an inner side of the package to an outer side thereof (for example, refer to Japanese Patent Application Laid-Open No. 2014-207275).

Japanese Patent Application Laid-Open No. 2014-207275 discloses a configuration that a resin protrusion is provided in a molding resin of a semiconductor device to increase a creeping distance between adjacent lead frames (corresponding to an electrode), and the resin protrusion is fitted into a through hole of a wiring substrate for a purpose of suppressing creeping current flowing in a surface of the molding resin.

In a technique described in Japanese Patent Application Laid-Open No, 2014-207275, an insulation distance between the adjacent lead frames can be secured by providing the resin protrusion in the molding resin, thus an interval between the adjacent lead frames can be reduced, that is to say, a size of the lead frames can be increased.

This configuration can flow larger current in the lead frame. As a result, there is a problem that a temperature of a semiconductor module increases at a time of operating the semiconductor module, and solder used in the semiconductor module is deteriorated, thus durability of the semiconductor module decreases.

It is considered that a heat sink is attached to the wiring substrate to increase a heat radiation property of the semiconductor module, however, there is a problem in the technique described in Japanese Patent Application Laid-Open No. 2014-207275 that the resin protrusion is fitted in the through hole of the wiring substrate, thus an insulation distance between the lead frame and the heat sink decreases. As described above, both the heat radiation property and an insulation property are hardly achieved in the semiconductor module by the technique described in Japanese Patent Application Laid-Open No. 2014-207275.

SUMMARY

An object of the present disclosure is to provide a semiconductor module capable achieving both a heat radiation property and an insulation property.

A semiconductor module according to the present disclosure includes a substrate, a semiconductor device, and a heat sink. The substrate includes a first main surface and a second main surface on a side opposite to the first main surface. The semiconductor device is mounted on the first main surface. The heat sink is attached to the second main surface via an insulation member having a thermal conductivity. The substrate includes a first through hole passing from the first main surface to the second main surface. The semiconductor device includes a plurality of electrodes exposed from a surface facing the first main surface and a protrusion formed between the plurality of electrodes to be inserted through the first through hole. The insulation member is formed so that a length in a thickness direction of the substrate is larger than that of a tip end portion of the protrusion protruding from the first through hole.

The insulation member is disposed between the substrate provided with the semiconductor device and the heat sink, thus the insulation distance between the plurality of electrodes and the heat sink can be secured. Furthermore, the heat generated in the plurality of electrodes is transmitted to the heat sink not only from the substrate but also from the tip end portion of the protrusion through the insulation member, and is radiated to an outer side by the heat sink. Accordingly, both the heat radiation property and the insulation property can be achieved in the semiconductor module.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
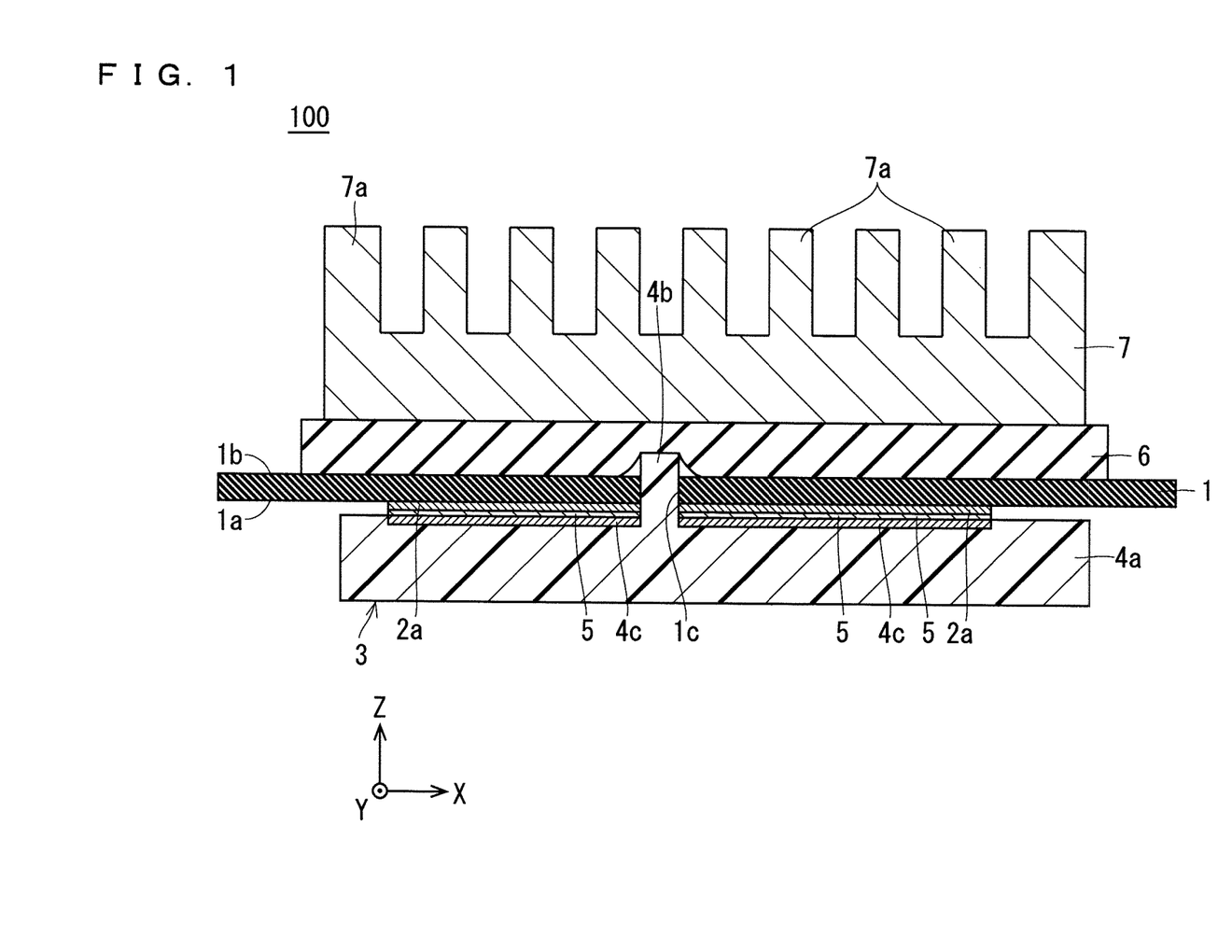
FIG. 1 is a cross-sectional view of a semiconductor module according to an embodiment 1.

An embodiment 1 is described hereinafter using the drawings. FIG. 1 is a cross-sectional view of a semiconductor module 100 according to the embodiment 1.

In FIG. 1, an X direction, a Y direction, and a Z direction are perpendicular to each other. An X direction, a Y direction, and a Z direction illustrated in the subsequent drawings are also perpendicular to each other. In the description hereinafter, a direction including the X direction and a −X direction as a direction opposite to the X direction is also referred to as "an X axis direction". In the description hereinafter, a direction including the Y direction and a −Y direction as a direction opposite to the Y direction is also referred to as "a Y axis direction". In the description hereinafter, a direction including the Z direction and a −Z direction as a direction opposite to the Z direction is also referred to as "a Z axis direction".

As illustrated in FIG. 1, the semiconductor module 100 includes a substrate 1, a semiconductor device 3, an insulation sheet 6 (corresponding to an insulation member), and a heat sink 7 having a plurality of fin parts 7a.

The substrate 1 includes a main surface 1a (corresponding to a first main surface), a main surface 1b (corresponding to a second main surface) on a side opposite to the main surface 1a, and a through hole 1c (corresponding to a first through hole). The through hole 1c passes from the main surface 1a to the main surface 1b to extend in the Y axis direction. A metal pattern 2a is provided on the main surface 1a of the substrate 1.

The semiconductor device 3 is mounted on the main surface 1a of the substrate 1. The semiconductor device 3 includes a body part 4a, a protrusion 4b, and a plurality of electrodes 4c. The body part 4a is formed of resin to have a rectangular shape in a view in the Z axis direction. The protrusion 4b is formed using resin between the plurality of electrodes 4c in the body part 4a, and protrudes on a side of the substrate 1 (the Z direction) and extends in the Y axis direction. The protrusion 4b is formed to be slightly smaller than a length of the through hole 1c in the X axis direction and the Y axis direction so as to be able to be inserted into the through hole 1c of the substrate 1. The protrusion 4b is longer than the substrate 1 in the thickness direction (the Z axis direction), thus a tip end portion of the protrusion 4b protrudes from the main surface 1b of the substrate 1 while the protrusion 4b is inserted through the through hole 1c of the substrate 1.

The plurality of electrodes 4c and the metal pattern 2a are joined by a joint material 5 while the protrusion 4b is inserted through the through hole 1c of the substrate 1, thus the semiconductor device 3 is mounted on the substrate 1. The joint material 5 is a solder or a conductive resin paste.

One or a plurality of protrusions 4b may be provided. When the plurality of protrusions 4b are provided, they are provided to be arranged at intervals in the X axis direction.

The insulation sheet 6 is formed of a sponge having a thermal conductivity, and is disposed on the main surface 1b of the substrate 1 to secure an insulation distance between the plurality of electrodes 4c and the heat sink 7. The heat sink 7 is fixed to the main surface 1b of the substrate 1 with a screw via the insulation sheet 6. The heat sink 7 may be co-fastened to the substrate 1 and the semiconductor device 3 via the insulation sheet 6.

The insulation sheet 6 is formed to be longer in the thickness direction (the Z axis direction) of the substrate 1 than the tip end portion of the protrusion 4b protruding from the through hole 1c. The insulation sheet 6 has flexibility to an extent that the tip end portion of the protrusion 4b can get into the insulation sheet 6 when having direct contact therewith. Accordingly, when the insulation sheet 6 is fixed to the substrate 1, the tip end portion of the protrusion 4b gets into the insulation sheet 6 but does not press the heat sink 7 via the insulation sheet 6.

The tip end portion of the protrusion 4b gets into the insulation sheet 6, thus heat generated in the plurality of electrodes 4c is transmitted to the heat sink 7 from not only the substrate 1 but also from the tip end portion of the protrusion 4b via the insulation sheet 6, and is radiated to an outer side by the heat sink 7. Herein, a magnitude relationship of a thermal conductivity of members constituting the semiconductor module 100 is as: the heat sink 7>the insulation sheet 6>the protrusion 4b>the substrate 1. Thus, in the semiconductor module 100, the heat is transmitted to the heat sink 7 more effectively than a case where the tip end portion of the protrusion 4b does not get into the insulation sheet 6.

As described above, the semiconductor module 100 according to the embodiment 1 includes: the substrate 1 having the main surface 1a and a main surface 1b on the side opposite to the main surface 1a, the semiconductor device 3 mounted on the main surface 1a; and the heat sink 7 attached to the main surface 1b via the insulation sheet 6 having the thermal conductivity, wherein the substrate 1 includes the through hole 1c passing from the main surface 1a to the main surface 1b, the semiconductor device 3 includes the plurality of electrodes 4c exposed from the surface facing the main surface 1a and the protrusion 4b formed between the plurality of electrodes 4c to be inserted through the through hole 1c, and the insulation sheet 6 is formed to be longer in the thickness direction (the Z axis direction) of the substrate 1 than the tip end portion of the protrusion 4b protruding from the through hole 1c.

The insulation sheet 6 is disposed between the substrate 1 provided with the semiconductor device 3 and the heat sink 7, thus the insulation distance between the plurality of electrodes 4c and the heat sink 7 can be secured. Furthermore, the heat generated in the plurality of electrodes 4c is transmitted to the heat sink 7 from not only the substrate 1 but also from the tip end portion of the protrusion 4b via the insulation sheet 6, and is radiated to an outer side by the heat sink 7. Accordingly, both the heat radiation property and the insulation property can be achieved in the semiconductor module 100. According to the above configuration, durability of the semiconductor module 100 can be increased.

Embodiment 2

Figure 2:
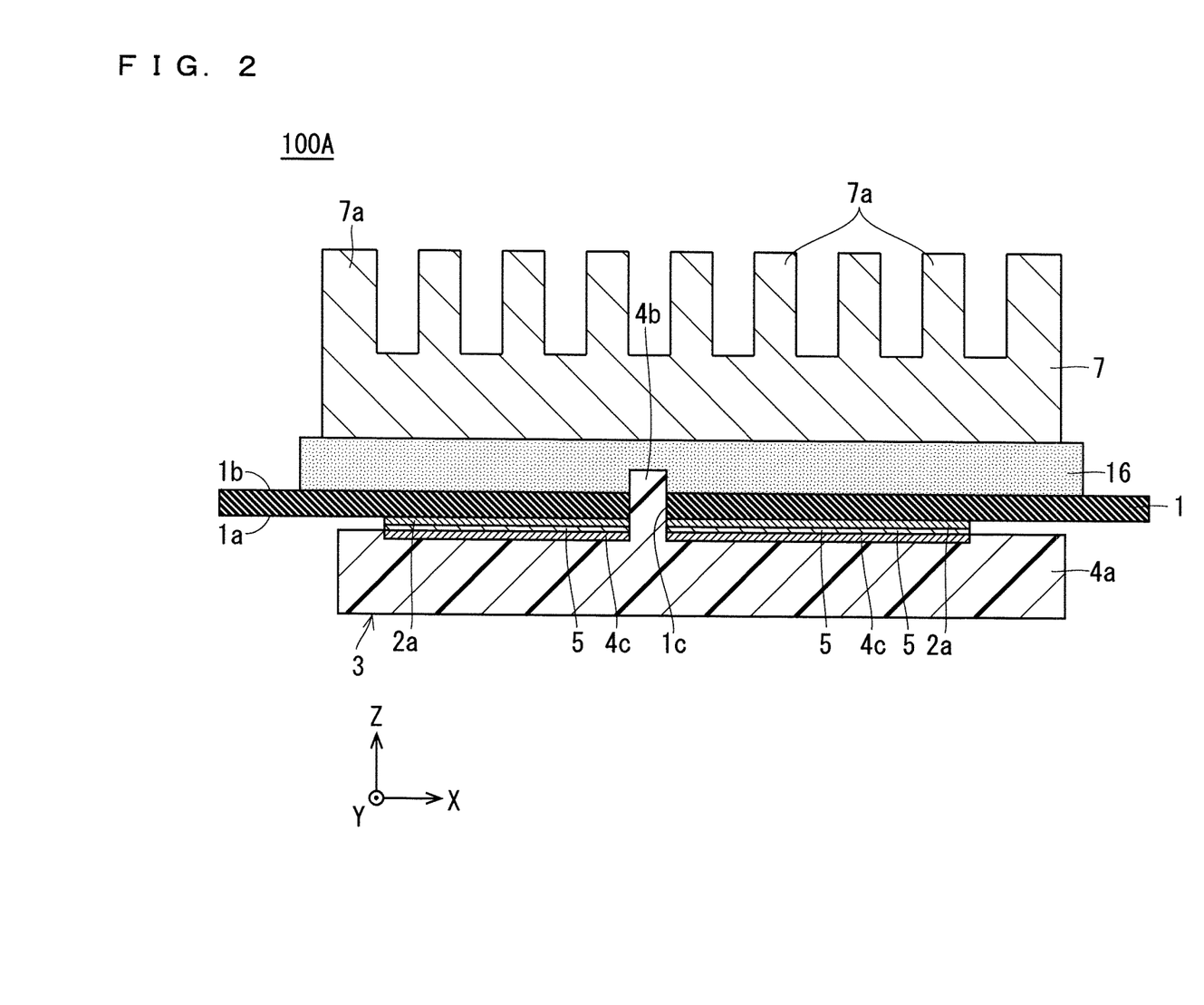
FIG. 2 is a cross-sectional view of a semiconductor module according to an embodiment 2.

A semiconductor module 100A according to an embodiment 2 is described next. FIG. 2 is a cross-sectional view of the semiconductor module 100A according to the embodiment 2. In the description in the embodiment 2, the same reference numerals are assigned to the same constituent elements as those described in the embodiment 1, and the description thereof will be omitted.

As illustrated in FIG. 2, in the embodiment 2, the semiconductor module 100A includes an adhesive agent 16 having the thermal conductivity and the insulation property in place of the insulation sheet 6.

The adhesive agent 16 is applied to the main surface 1b of the substrate 1 to secure the insulation distance between the plurality of electrodes 4c and the heat sink 7. The substrate 1 and the heat sink 7 are joined by the adhesive agent 16. The adhesive agent 16 is applied to be longer in the thickness direction (the Z axis direction) of the substrate 1 than the tip end portion of the protrusion 4b protruding from the through hole 1c, thus the tip end portion of the protrusion 4b is not exposed from the adhesive agent 16. Herein, the adhesive agent 16 corresponds to the insulating member.

As described above, the semiconductor module 100A according to the embodiment 2 includes the adhesive agent 16 having the thermal conductivity and the insulation property in place of the insulation sheet 6, thus can have the effect similar to the case in the embodiment 1.

Embodiment 3

Figure 3:
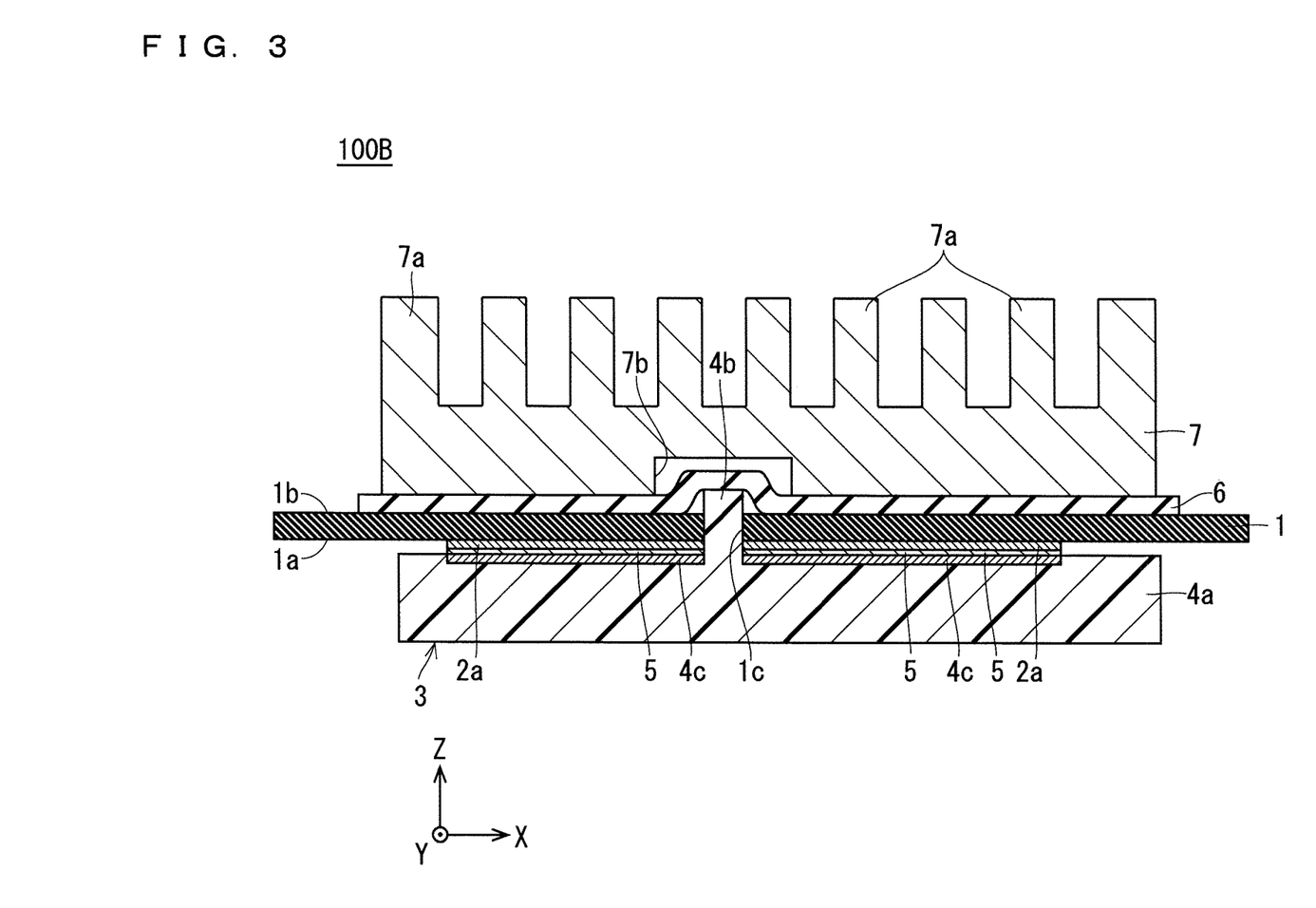
FIG. 3 is a cross-sectional view of a semiconductor module according to an embodiment 3.

A semiconductor module 100B according to an embodiment 3 is described next. FIG. 3 is a cross-sectional view of the semiconductor module 100B according to the embodiment 3. In the description in the embodiment 3, the same reference numerals are assigned to the same constituent elements as those described in the embodiments 1 and 2, and the description thereof will be omitted.

When the length of the substrate 1 in the thickness direction (the Z axis direction) in the insulation sheet 6 increases, a thermal conductivity performance of heat from the insulation sheet 6 to the heat sink 7 decreases, thus the length of the substrate 1 in the thickness direction (the Z axis direction) in the insulation sheet 6 is preferably short.

Thus, in the embodiment 3, as illustrated in FIG. 3, the insulation sheet 6 has a configuration that the length of the substrate 1 in the thickness direction (the Z axis direction) is formed to be smaller than that of the tip end portion of the protrusion 4b, and a groove 7b in which the tip end portion of the protrusion 4b is housed via the insulation sheet 6 is formed in a surface of the heat sink 7 facing the insulation sheet 6.

In the embodiment 3, the length of the substrate 1 in the thickness direction (the Z axis direction) in the insulation sheet 6 is approximately one third of the case in the embodiment 1. The length of the substrate 1 in the thickness direction (the Z axis direction), the X axis direction, and the Y axis direction in the groove 7b is formed to be larger than the length of the substrate 1 in the thickness direction (the Z axis direction), the X axis direction, and the Y axis direction in the tip end portion of the protrusion 4b so that the tip end portion of the protrusion 4b can be housed in the groove 7b via the insulation sheet 6.

As described above, in the semiconductor module 100B according to the embodiment 3, the insulation sheet 6 has a configuration that the length of the substrate 1 in the thickness direction (the Z axis direction) is formed to be smaller than that of the tip end portion of the protrusion 4b, and the groove 7b in which the tip end portion of the protrusion 4b is housed via the insulation sheet 6 is formed in the surface of the heat sink 7 facing the insulation sheet 6.

Accordingly, both the heat radiation property and the insulation property can be achieved in the semiconductor module 100B. Furthermore, the thermal conductivity performance of the heat from the insulation sheet 6 to the heat sink 7 can be increased more than the case in the embodiment 1, thus the heat radiation property of the semiconductor module 100B can be increased more than the case in the embodiment 1.

When the heat sink 7 is formed by extruding, the groove 7b can be formed at the same time, thus manufacturing cost of the semiconductor module 100B does not increase compared with the case in the embodiment 1.

Embodiment 4

Figure 4:
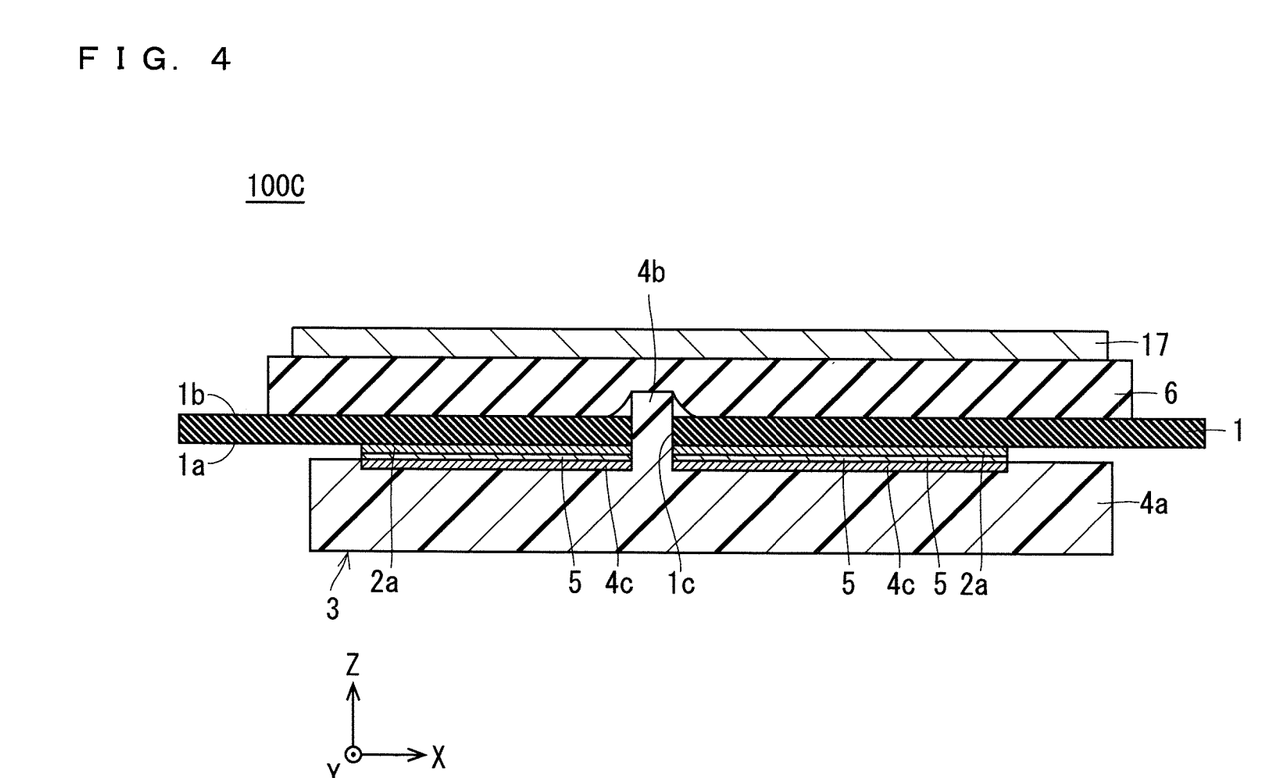
FIG. 4 is a cross-sectional view of a semiconductor module according to an embodiment 4.

A semiconductor module 100C according to an embodiment 4 is described next. FIG. 4 is a cross-sectional view of a semiconductor module 100C according to the embodiment 4. In the description in the embodiment 4, the same reference numerals are assigned to the same constituent elements as those described in the embodiments 1 to 3, and the description thereof will be omitted.

In the embodiment 1, the heat sink 7 is provided to increase the heat radiation property of the semiconductor module 100, however, in a case where the heat radiation property lower than the that of the heat sink 7 is applicable, as illustrated in FIG. 4, a heat radiation plate 17 made of ceramic having a length in the thickness direction (the Z axis direction) of the substrate 1 smaller than the heat sink 7 is provided in place of the heat sink 7. A method of attaching the heat radiation plate 17 is similar to the case in the heat sink 7. The heat radiation plate 17 can be applied to the semiconductor modules 100A and 100B according to the embodiments 2 and 3.

As described above, the semiconductor module 100C according to the embodiment 4 includes the heat radiation plate 17 having the length in the thickness direction (the Z axis direction) of the substrate 1 smaller than the heat sink 7 in place of the heat sink 7.

The heat radiation plate 17 is light in weight than the heat sink 7, thus the semiconductor module 100 C having higher vibration resistance than the case in the embodiment 1 can be achieved.

Embodiment 5

Figure 5:
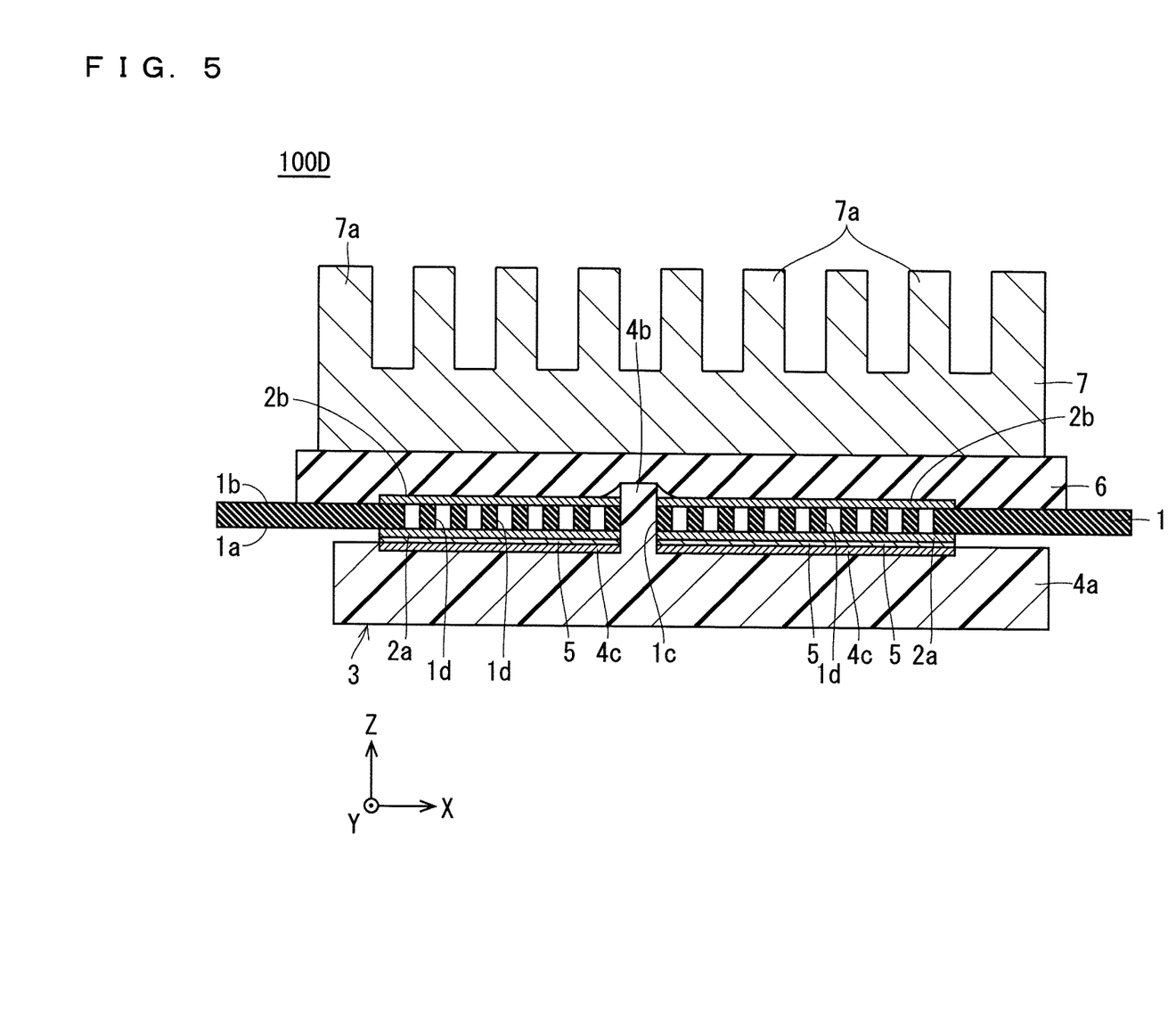
FIG. 5 is a cross-sectional view of a semiconductor module according to an embodiment 5.

A semiconductor module 100D according to an embodiment 5 is described next. FIG. 5 is a cross-sectional view of a semiconductor module 100D according to the embodiment 5. In the description in the embodiment 5, the same reference numerals are assigned to the same constituent elements as those described in the embodiments 1 to 4, and the description thereof will be omitted.

As illustrated in FIG. 5, in the embodiment 5, a through hole 1d (corresponding to a second through hole) passing from the main surface 1a to the main surface 1b is formed in the substrate 1 separately from the through hole 1c. Metal patterns 2a and 2b covering the through hole 1d are provided in the main surface 1a and the main surface 1b, respectively. A conductive film (not shown in the drawings) is provided on an inner wall of the through hole 1d for electrical conduction of the metal patterns 2a and 2b. Accordingly, it is possible to flow current in the main surface 1a and the main surface 1b as both surfaces of the substrate 1.

One or a plurality of through holes 1d may be provided. The through hole 1d can also be applied to the semiconductor modules 100A, 100B, and 100C according to the embodiments 2 to 4.

As described above, the semiconductor module 100D according to the embodiment 5 has the configuration that the through hole 1d passing from the main surface 1a to the main surface 1b is formed in the substrate 1 separately from the through hole 1c, and the metal patterns 2a and 2b covering the through hole 1d are provided in the main surface 1a and the main surface 1b, respectively.

Accordingly, the heat generated in the plurality of electrodes 4c is transmitted from the metal pattern 2a to the metal pattern 2b through the through hole 1d, thus the heat radiation property is increased more than the case where the through hole 1d is not provided. It is possible to flow current in the main surface 1a and the main surface 1b as both surfaces of the substrate 1, thus heat generation in the substrate 1 can also be suppressed.

Embodiment 6

Figure 6:
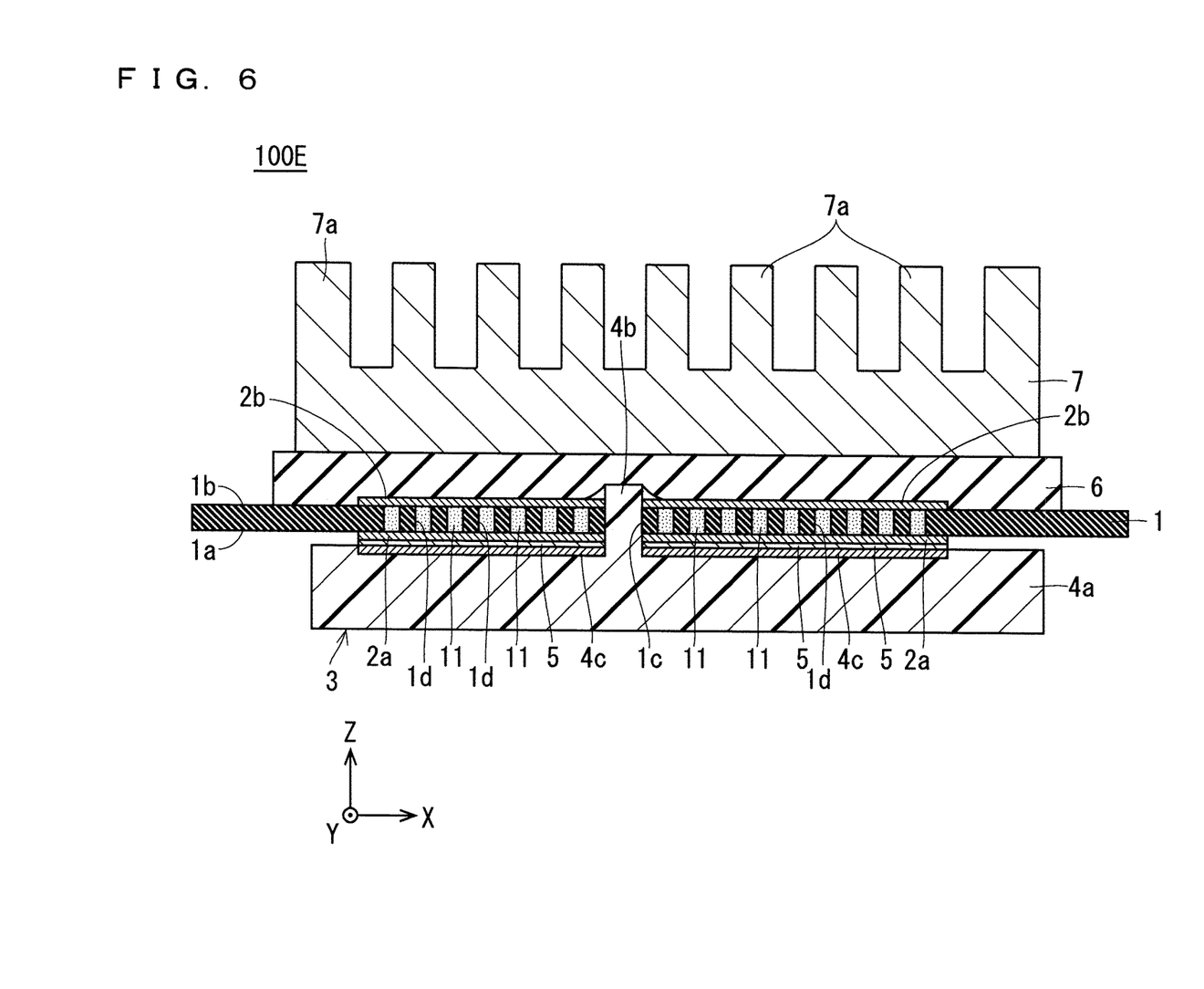
FIG. 6 is a cross-sectional view of a semiconductor module according to an embodiment 6.

A semiconductor module 100E according to an embodiment 6 is described next. FIG. 6 is a cross-sectional view of the semiconductor module 100E according to the embodiment 6. In the description in the embodiment 6, the same reference numerals are assigned to the same constituent elements as those described in the embodiments 1 to 5, and the description thereof will be omitted.

As illustrated in FIG. 6, in the embodiment 6, the through hole 1d of the substrate 1 is filled with a grease 11 having a heat radiation property. The through hole 1d may be filled with a gel having a thermal conductivity in place of the grease 11. The structure of filling the through hole 1d with the grease 11 having the heat radiation property or the gel having the thermal conductivity can also be applied to the semiconductor modules 100A, 100B, and 100C according to the embodiments 2 to 4.

As described above, in the semiconductor module 100E according to the embodiment 6, the through hole 1d is filled with the grease 11 having the heat radiation property or the gel having the thermal conductivity, thus the heat radiation property can be increased more than the case in the embodiment 5.

Each embodiment can be arbitrarily combined, or each embodiment can be appropriately varied or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module, comprising:
   a substrate having a first main surface and a second main surface on a side opposite to the first main surface in a first direction;
   a semiconductor device mounted on the first main surface;
   a joint material that joins the semiconductor device to the substrate; and
   a heat sink attached to the second main surface via an insulation member having a thermal conductivity, wherein
   the substrate includes a first through-hole passing from the first main surface to the second main surface,
   the semiconductor device includes a plurality of electrodes on and exposed from a surface facing the first main surface, the plurality of electrodes being electrically connected to a metal pattern of the substrate by way of the joint material,
   the semiconductor device includes a protrusion formed directly between the plurality of electrodes in a second direction perpendicular to the first direction, the protrusion being in direct contact with the plurality of electrodes, and the protrusion being inserted through the first through-hole, and the protrusion being a continuous structure with the semiconductor device, the protrusion extending from the semiconductor device, and
   the insulation member is formed so that a length in a thickness direction of the substrate is larger than a length of a tip end portion of the protrusion protruding from the first through-hole.

2. A semiconductor module, comprising:
   a substrate having a first main surface and a second main surface on a side opposite to the first main surface;
   a semiconductor device mounted on the first main surface; and
   a heat sink attached to the second main surface via an insulation member having a thermal conductivity, wherein
   the substrate includes a first through-hole passing from the first main surface to the second main surface,
   the semiconductor device includes a plurality of electrodes exposed from a surface facing the first main surface and a protrusion formed between the plurality of electrodes to be inserted through the first through-hole,
   the insulation member is formed so that a length in a thickness direction of the substrate is smaller than a length of a tip end portion of the protrusion protruding from the first through-hole, and
   a groove in which the tip end portion of the protrusion is housed via the insulation member is formed in a surface of the heat sink facing the insulation member such that the insulation member extends along the second main surface between the substrate and the heat sink and across the groove.

3. The semiconductor module according to claim 1 comprising a heat radiation plate having a length in a thickness direction of the substrate smaller than a length of the heat sink in place of the heat sink.

4. The semiconductor module according to claim 2 comprising a heat radiation plate having a length in a thickness direction of the substrate smaller than a length of the heat sink in place of the heat sink.

5. The semiconductor module according to claim 1, wherein
   a second through-hole passing from the first main surface to the second main surface is formed in the substrate separately from the first through-hole, and
   a metal pattern covering the second through-hole is provided on the first main surface and the second main surface.

6. The semiconductor module according to claim 2, wherein
   a second through-hole passing from the first main surface to the second main surface is formed in the substrate separately from the first through-hole, and
   a metal pattern covering the second through-hole is provided on the first main surface and the second main surface.

7. The semiconductor module according to claim 5, wherein
   the second through-hole is filled with a grease having a heat radiation property or a gel having a thermal conductivity.

8. The semiconductor module according to claim 6, wherein
   the second through-hole is filled with a grease having a heat radiation property or a gel having a thermal conductivity.

9. The semiconductor module according to claim 1, wherein the semiconductor device is mounted on top of the first main surface and the plurality of electrodes are entirely above the first main surface.

10. The semiconductor module according to claim 1, wherein a thermal conductivity of the protrusion has a greater magnitude than a thermal conductivity of the substrate.

* * * * *